(12) United States Patent
Rhee

(10) Patent No.: US 6,349,117 B1
(45) Date of Patent: Feb. 19, 2002

(54) RECURSIVE DECODER ARCHITECTURE FOR BINARY BLOCK CODES

(75) Inventor: Dojun Rhee, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/088,429

(22) Filed: Jun. 1, 1998

(51) Int. Cl.[7] ............................. H04L 5/12; H04L 23/02
(52) U.S. Cl. ...................................... 375/265; 714/792
(58) Field of Search .................................. 375/340, 341, 375/262, 265; 348/726; 714/792, 794, 795, 796, 755

(56) References Cited

U.S. PATENT DOCUMENTS 5,717,471 A * 2/1998 Stewart ...................... 348/726
5,983,385 A * 11/1999 Khayrallah et al. ......... 714/755

* cited by examiner

Primary Examiner—Jean Corrielus

(57) ABSTRACT

A recursive decoder for decoding a binary codeword of length N having a first stage, at least one intermediate stage, and a final stage. The first stage including a plurality of decoder groups, each of the groups having a plurality of sets of first and second decoders, each of the first and second decoders having a plurality of inputs and an output, a plurality of adder groups, each of the adders having a first input connected to the output of the first decoder of one of the sets and a second input connected to the output of the second decoder of one of the sets, and an output. The at least one intermediate stage including at least one decoder group, each of the at least one decoder group having a plurality of sets of first and second comparators, each of the first and second comparators having inputs and an output, the inputs of each of the comparators in a first intermediate stage connected to the outputs of one of the plurality of adder groups, at least one adder group, each of the adders having a first input connected to the output of the first comparator of one of the sets and a second input connected to the output of the second comparator of one of the sets, and an output, the inputs of each of the comparators in other than the first intermediate stage connected to the outputs of one of at least one adder group. The final stage, including a comparator having inputs and an output, the inputs connected to the outputs of a final intermediate stage.

5 Claims, 5 Drawing Sheets

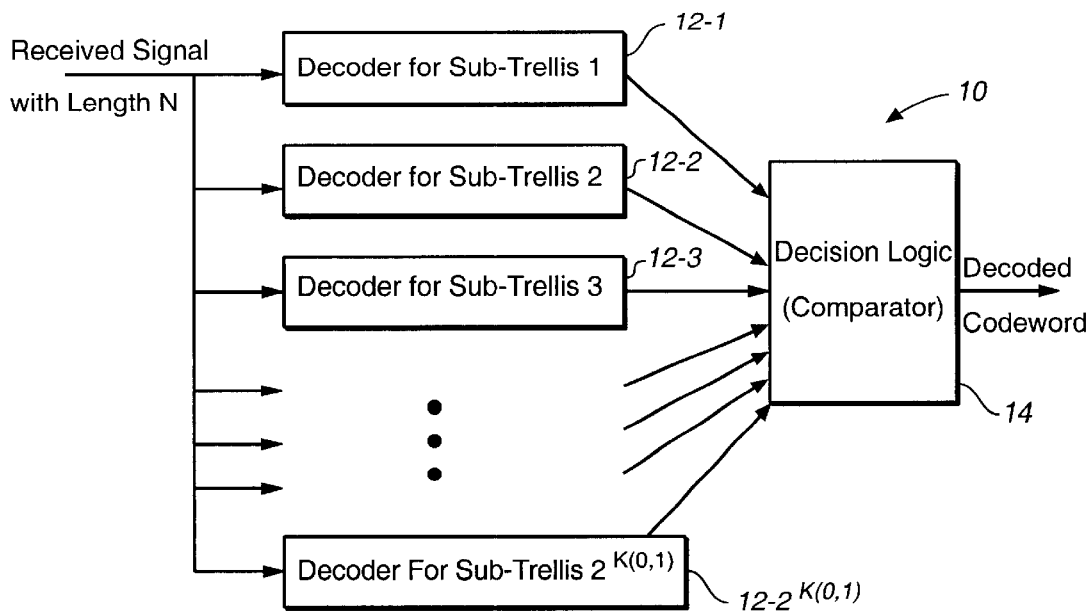
FIG._1
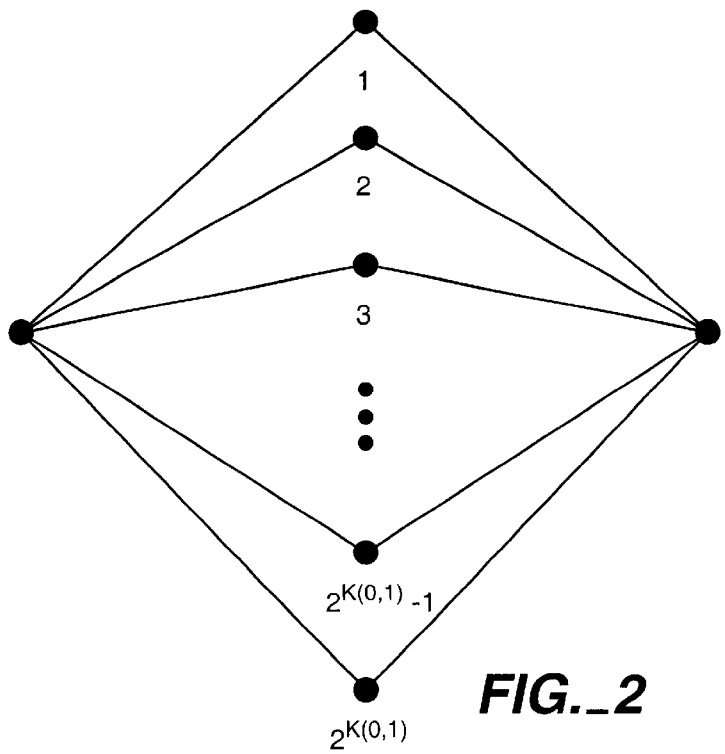
FIG._2

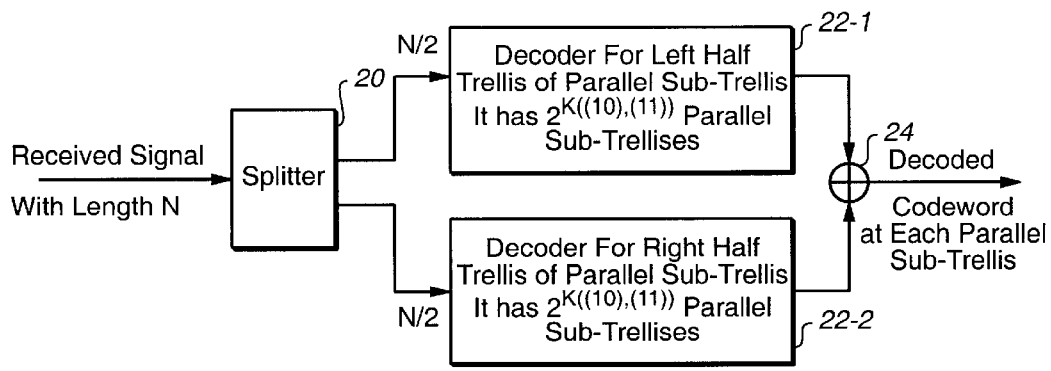
FIG._3
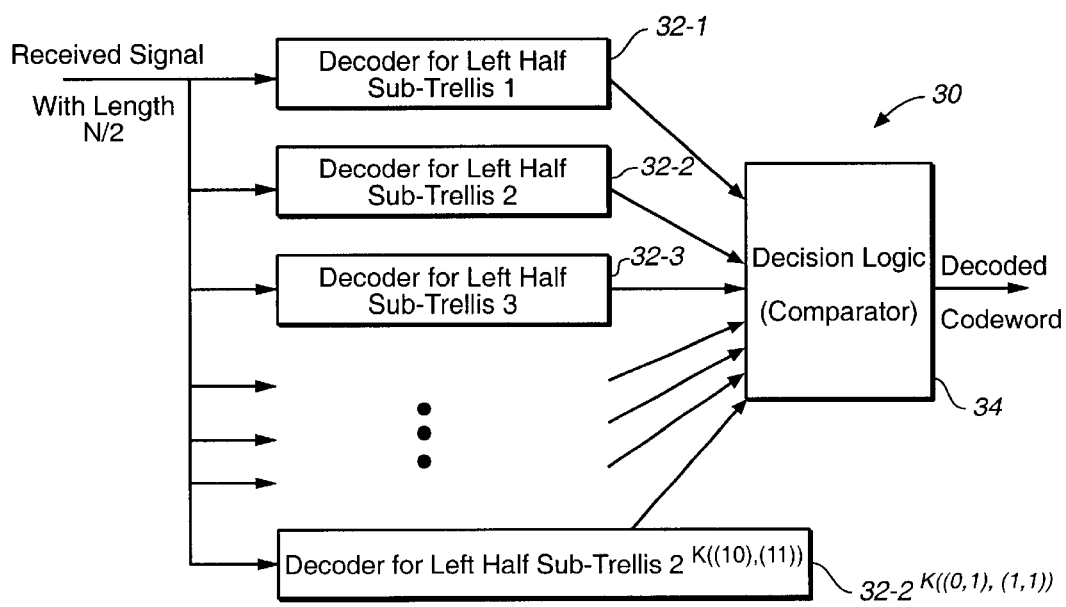
FIG._4

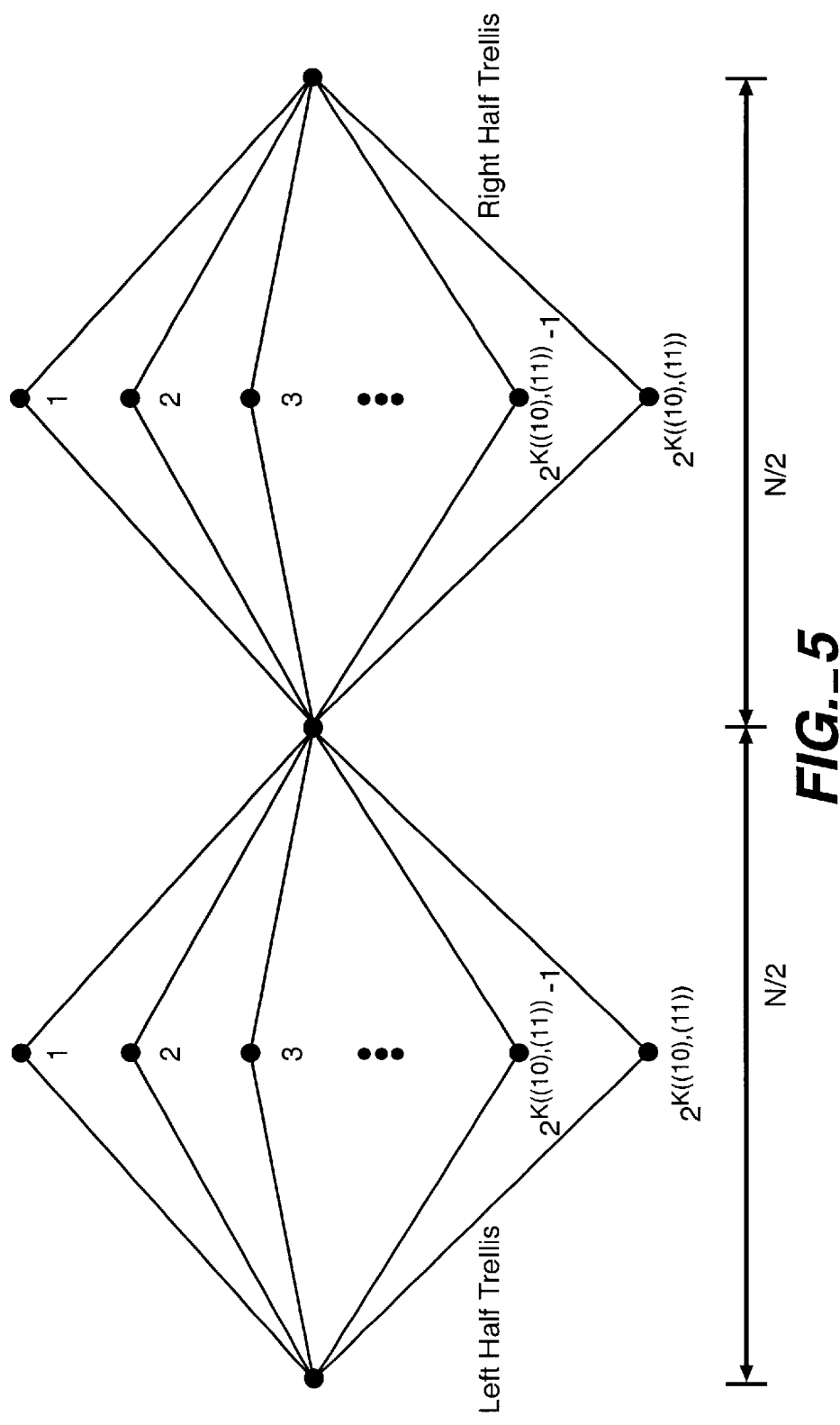
FIG._5

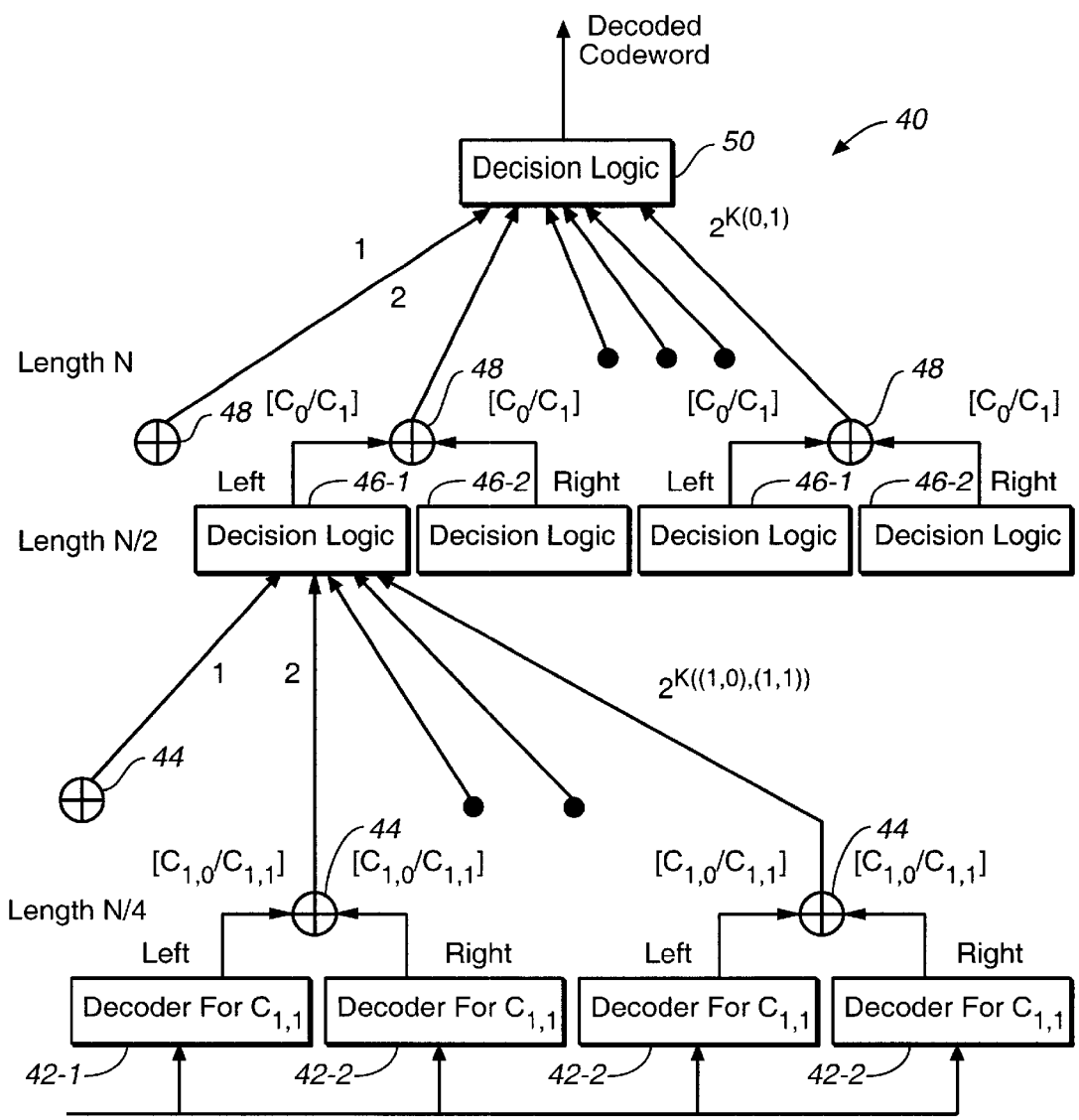
FIG._6

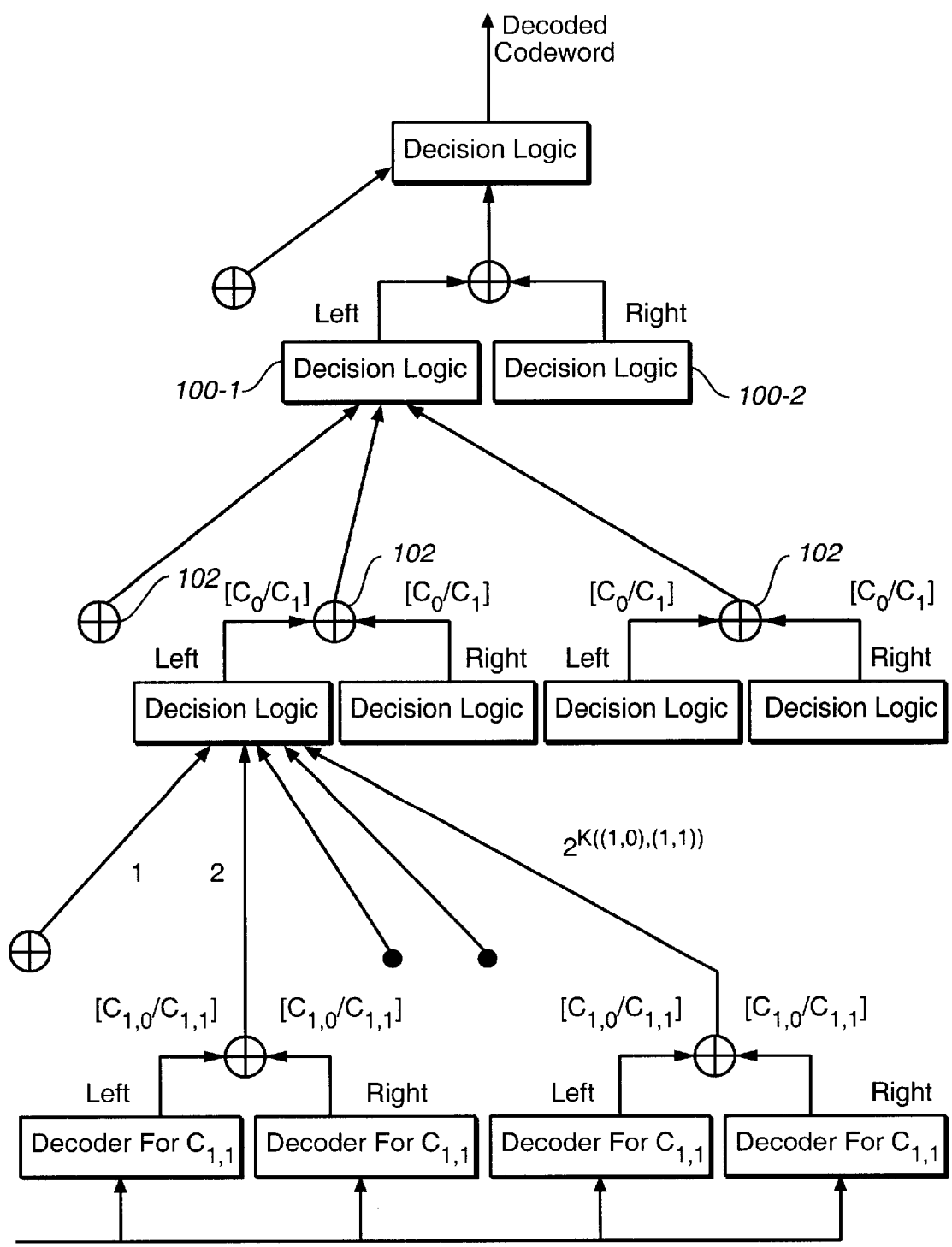
FIG._7

RECURSIVE DECODER ARCHITECTURE FOR BINARY BLOCK CODES

BACKGROUND OF THE INVENTION

1. Field of the Invention

The present invention relates to decoder architectures. More particularly, the present invention relates to a recursive decoder architecture which performs the decoding in a parallel structure.

2. The Prior Art

In high speed data transmission over such mediums as satellite, telephone, co-axial cable, and optical fiber, very efficient and fast decoders are of critical importance. As such, in the prior art, many methods are known for decoding a binary block codeword of a specified length and having a particular dimension K, wherein $2^k$ defines the number of possible combinations of different codewords for the specified length N. These methods typically involve decomposing the binary block codewords into several sections of parallel sub-trellises, as is understood by those of ordinary skill in the art. Decoding of the various sections of sub-trellises are then performed.

One of the most widely employed methods for decomposing the codeword into sub-trellises for decoding employs the Viterbi algorithm. In the decomposition of the binary codewords, according to the Viterbi algorithm, the decoder constructed in accordance thereby uses information from previous parallel sub-trellis sections to determine survivors for subsequent parallel sub-trellis sections. Accordingly, the parallel sub-trellises of the decoder are decoded in a sequential manner.

It is, therefore, an object of the present invention, to avoid the disadvantages presented by the sequential decoding found in Viterbi decoders, by forming a decoder wherein all of the decoding can be formed at once in parallel.

BRIEF DESCRIPTION OF THE INVENTION

In the present invention, a recursive decoder implements a decoding method wherein a binary block codeword can be decomposed such that short decoding at a first stage can be performed in a massively parallel fashion. In subsequent stages, a series of comparisons and additions are then be made until the codeword is fully decoded.

BRIEF DESCRIPTION OF THE DRAWINGS

FIG. 1 illustrates a block diagram of decoder for decoding a binary block code having a length of N binary bits and a dimension K according to the present invention.

FIG. 2 illustrates a trellis of $2^{k(0,1)}$ parallel sub-trellises implemented by the decoder depicted in FIG. 1. according to the present invention.

FIG. 3 illustrates a block diagram of a decoder architecture for splitting each of the $2^{k(0,1)}$ parallel sub-trellises depicted in FIG. 3 into left and right halves according to the present invention.

FIG. 4 illustrates a block diagram of decoder for decoding a binary block code having a length of N/2 binary bits and a dimension K(0,1) according to the present invention.

FIG. 5 illustrates a trellis of two sets of $2^{k(0,1)}$ parallel sub-trellises implemented by the decoder depicted in FIG. 4. according to the present invention.

FIG. 6 illustrates a block diagram of a decoder architecture for decoding a binary block codeword by recursive decomposition according to the present invention.

FIG. 7 is a block diagram illustrating a decoder architecture with more than one intermediate stage in accordance with a specific embodiment of the present invention.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

FIG. 1 illustrates a decoder 10 according to the present invention for decoding a binary block code having a length of N binary bits and a dimension K wherein $2^K$ is the number of members in the set containing the possible binary block codes. In the decoder 10, the code word of length N is fed into decoders 12-1 through 12-$2^{K(0,1)}$. The dimension K(0,1) will be explained in detail below. In each of the decoders 12-1 through 12-$2^{K(0,1)}$, the value of the euclidean distance between the binary code word and the value in each of the decoders 12-1 through 12-$2^{K(0,1)}$ will be determined. The euclidean distance as determined in each of the decoders 12-1 through 12-$2^{K(0,1)}$ is then squared. Each of the squared euclidian distances are then compared with one another in comparator and selector 14. The value in the decoder 12-1 through 12-$2^{K(0,1)}$ from which the smallest squared euclidian distance was determined is selected as the output from comparator and selector 14 as the decoded code word. The implementation of decoders 12-1 through 12-$2^{K(0,1)}$, as well as the comparator and selector 14 are well within the skill of those of ordinary skill in the art, and will be not described herein in detail to avoid overcomplicating the disclosure and thereby obscuring the present invention.

According to the present invention, the code word of length N is a binary block code which has been formed according to the method of |U|U+V|. In this method of code word construction, it will be appreciated that the notation |X|Y| refers to the concatenation of vectors X and Y. With the |U|U+V| construction method, a binary block code C with length N is constructed as follows:

$$C=|C_0|C_0+C_1|$$

In this expression, $C_0$ is a binary block code having a length of N/2, and, $C_1$ is a binary block code that is a sub-code of binary block code $C_0$. Binary block code $C_1$ also has a length of N/2. Given this construction of binary block code C, the generator matrices G, $G_0$, and $G_1$ for the binary block codes C, $C_0$, and $C_1$, respectively, may be expressed as follows:

$$G = \begin{bmatrix} G_0 & G_0 \\ 0 & G_1 \end{bmatrix}$$

With the binary block code $C_1$ as a sub-code of binary block code $C_0$ the coset decomposition of $C_0$ may be expressed as follows:

$$C_0=C_1+[C_0/C_1]$$

In the above expression, the term $[C_0/C_1]$ identifies the cosets that along with $C_1$ comprise the full set of binary block codes $C_0$. The number of the coset codes $[C_0/C_1]$ has the dimension K(0,1), which is determined by subtracting the dimension of the binary block code $C_1$ from the dimension of the binary block code $C_0$. From this it should be appreciated that the binary block code $C_0$ comprises $2^{k(0,1)}$ cosets of binary block codes $C_1$. By indicating the generator matrix for the $[C_0/C_1]$ coset code as $G_{0,1}$ the generator matrix for the binary block code $C_0$ may be expressed as follows:

$$G_0 = \begin{bmatrix} G_{0,1} \\ G_1 \end{bmatrix}$$

By combining this generator matrix for $G_0$ with the generator matrix for G given above, it may be observed that the generator matrix for the binary block code C which contains the coset information for the cosets $C_1$ and $C_0$ may be expressed as follows:

$$G = \begin{bmatrix} G_{0,1} & G_{0,1} \\ G_1 & 0 \\ 0 & G_1 \end{bmatrix}$$

In FIG. 2, a trellis of binary block code C having a length N is implemented with $2^{k(0,1)}$ parallel sub-trellises from the above expression of the generator matrix, G. It should be appreciated that according to the present invention, that $2^{k(0,1)}$ parallel sub-trellises shown in FIG. 2 are implemented by the 1 through $2^{k(0,1)}$ decoders and the comparator 14 illustrated in FIG. 1.

According to the present invention, as will be explained below, it is appreciated that each of the $2^{k(0,1)}$ parallel sub-trellises depicted in FIG. 2 may be split in half and decoded at the same time as illustrated by FIG. 3. When each of the $2^{k(0,1)}$ parallel sub-trellises shown in FIG. 2 is split by splitter 20 shown in FIG. 3, the binary block code length for each left and right half being decoded is reduced from N to N/2. Each of the left and right halves of the $2^{k(0,1)}$ parallel sub-trellises are then decoded by left and right half decoders 22-1 and 22-2. The outputs of left and right half decoders 22-1 and 22-2 are added together by adder 24. The left half decoder 22-1 is illustrated in FIG. 4. It should be appreciated that a similar implementation may be made for the right half decoder 22-2. Further, the implementation of splitter 20 and adder 24 are well within the skill of those of ordinary skill in the art, and will be not described herein in detail to avoid overcomplicating the disclosure and thereby obscuring the present invention.

According to the present invention, when both the left and right halves of each of the $2^{k(0,1)}$ parallel sub-trellises depicted in FIG. 2 are decoded, they are decoded based upon a coset decomposition similar to the coset decomposition described above. Accordingly, in the decoder 30 of FIG. 4, the code word of length N/2 is fed into decoders 32-1 through $32\text{-}2^{K((0,1),(1,1))}$. The dimension K((0,1),(1,1)) will be explained in detail below. In each of the decoders 32-1 through $32\text{-}2^{K((0,1),(1,1))}$, the value of the euclidean distance between the binary code word and the value in each of the decoders 32-1 through $32\text{-}2^{K((0,1),(1,1))}$ will be determined. The euclidean distance as determined in each of the decoders 32-1 through $32\text{-}2^{K((0,1),(1,1))}$ is then squared. Each of the squared euclidian distances are then compared with one another in comparator and selector 34. The value in the decoders 32-1 through $32\text{-}2^{K((0,1),(1,1))}$ from which the smallest squared euclidian distance was determined is selected to form the output from comparator and selector 36 as the decoded code word.

In decoding the left half of each of the each of the $2^{k(0,1)}$ parallel sub-trellises depicted in FIG. 2 by the decoders 32-1 through $32\text{-}2^{K((0,1),(1,1))}$, it should be observed that each of the $2^{k(0,1)}$ parallel sub-trellises is isomorphic to the trellis of the code generated by the following generator matrix.

$$G = \begin{bmatrix} G_1 & 0 \\ 0 & G_1 \end{bmatrix}$$

The code generated by this generator matrix is $|C_1|C_1|$, which will be appreciated is a concatenation of the binary block code $C_1$ with itself.

Now $C_1$ may be expressed as:

$$C_1 = |C_{1,0}|C_{1,0} + C_{1,1}|$$

In this expression, $C_{1,0}$ is a binary block code having a length of N/4, and, $C_{1,1}$ is a binary block code that is a sub-code of binary block code $C_{1,0}$. Binary block code $C_{1,1}$ also has a length of N/4. $C_{1,0}$. For the binary block codes $C_{1,1}$ and $C_{1,0}$ the generator matrices are $G_{1,1}$ and $G_{1,0}$.

Those of ordinary skill in the art will realize that because binary block code $C_1$ is a sub code of binary block code $C_0$, that the coset decomposition of $C_0$ may be expressed as follows:

$$C_{1,0} = C_{1,1} + [C_{1,0}/C_{1,1}]$$

In the above expression, the term $[C_{1,0}/C_{1,1}]$ identifies the cosets that along with $C_{1,1}$ comprise the full set of binary block codes $C_{1,0}$. The number of the coset codes $[C_{1,0}/C_{1,1}]$ has the dimension K((10),(11)), which is determined by subtracting the dimension of the binary block code $C_{1,1}$ from the dimension of the binary block code $C_{1,0}$. From this it should be appreciated that the binary block code $C_{1,0}$ comprises $2^{k((10),(11))}$ cosets of binary block codes $C_{1,1}$. By indicating the generator matrix for the $[C_{1,0}/C_{1,1}]$ coset code as $G_{(01),(11)}$ the generator matrix for the binary block code $C_{1,0}$ may be expressed as follows:

$$G_{1,0} = \begin{bmatrix} G_{(10),(11)} \\ G_{1,1} \end{bmatrix}$$

Accordingly, the generator matrix for the binary block code $C_1$ which contains the coset information for the cosets $C_{1,1}$ and $C_{1,0}$ may be expressed as follows:

$$G_1 = \begin{bmatrix} G_{(10),(11)} & G_{(10),(11)} \\ G_{1,1} & 0 \\ 0 & G_{1,1} \end{bmatrix}$$

In FIG. 5, a trellis of binary block code of the construction $|C_1|C_1|$ having a length N is implemented with two sets of $2^{k((10),(11))}$ parallel sub-trellises, each of length N/2, wherein each set is derived from the above expression of the generator matrix, $G_1$. It should be appreciated that according to the present invention, that each of the two sets of $2^{k((10),(11))}$ parallel sub-trellises shown in FIG. 5 are implemented by the 1 through $2^{k((10),(11))}$ decoders and the comparator 14 illustrated in FIG. 4, and that the two sets of $2^{k((10),(11))}$ parallel sub-trellises together are depicted in FIG. 3.

According to this present invention, the recursive decomposition, wherein the $2^{k(0,1)}$ parallel sub-trellises are split into left and right halves and further compassed as $2^{k((10),(11))}$ parallel sub-trellises may be performed until each branch of every sub-trellis is an acceptedly short and simple binary code. Accordingly, when the binary code to be compared is relatively short and simple, the components for implementing the decoders for each of these sub-trellises as well as the adders, comparators, and selectors may be very simply implemented with a variety of components well understood by those of ordinary skill in the art. Since, regardless of the number of decompositions that occur, the decoding only occurs in the lowest level of sub-trellis and also in parallel, the efficiency, and speed of this decoder far exceeds those of decoders known in the art.

In FIG. 6, the recursive nature of the decoder architecture 40 of the present invention is more fully depicted. In decoder architecture 40, a further decomposition of the left and right halves of the sub-trellises as depicted in FIG. 5 has been made so that decoder 40 having more than two stages is illustrated. In decomposing the set of parallel sub-trellises in FIG. 5, it should be appreciated that each half of the parallel sub-trellises depicted in FIG. 5 is decomposed into a set of parallel sub-trellises. As an example, in a first stage of the decoder 40, one of the parallel sub-trellises from FIG. 5 is implemented as a decoder for a codeword of length N/4 by a group formed by sets of left and right decoders 42-1 and 42-2. Each right and left set of decoders 42-1 and 42-2 implements one of the group of parallel sub-trellis implementing one of the parallel sub-trellises in FIG. 5. The left and right halves of each of the parallel sub-trellises are then added together in adders 44.

In a subsequent intermediate stage, each of the decoded sub-trellises of length N/4 for each left and right half of a sub-trellis of length N/2 are then compared by comparators 46-1 and 46-2 to determine the smallest squared euclidian distance as described above. The comparators 46-1 and 46-2, in FIG. 6, corresponds to the comparator 34 in FIG. 4. The output of comparators 46-1 and 46-2 are then added together by adders 48. The adders 48 in FIG. 6 correspond to the adders 24 in FIG. 3. It should be appreciated that according to the present invention as the number of recursive decompositions of parallel sub-trellises increase that the number of intermediate stages will also increase. Also, as the number of recursive decompositions of parallel sub-trellises increase, the length of the word being decoded in the first stage decreases. The length of the codeword being decoded in the first stage is related to the number recursive decompositions, M, as $N/2^M$. In a final stage, the outputs of adders 48 are then compared by comparator 50. The comparator 50 in FIG. 6 corresponds to the comparator 14 in FIG. 1. At each intermediate stage after the first intermediate stage, the input or inputs to comparators are coupled to outputs of at least one adder group. As can also be seen from FIG. 6, there may be one or more intermediate stages coupled between the first intermediate stage and the final intermediate stage.

Therefore, in accordance with the present invention, the recursive decoder implements a decoding method wherein a binary block codeword can be decomposed such that short decoding at a first stage can be performed in a massively parallel fashion. In subsequent stages, a series of comparisons and additions are then be made until the codeword is fully decoded.

FIG. 7 is a block diagram illustrating a decoder architecture with more than one intermediate stage in accordance with a specific embodiment of the present invention. FIG. 7 is essentially identical to FIG. 6, except that a second intermediate stage is depicted having decision logic 100-1, 100-2 with inputs coupled to the outputs of adders 102 of the first intermediate stage.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A recursive decoder for decoding a binary codeword of length N comprising:
   a first stage, including:
      a plurality of decoder groups, each of said groups having a plurality of sets of first and second decoders, each of said first and second decoders having an input and an output;
      a plurality of adder groups, each of said adders having a first input connected to said output of said fist decoder of one of said sets and a second input connected to said output of said second decoder of one of said sets, and an output;
   at least one intermediate stage, each intermediate stage including:
      at least one decoder group, each of said at least one decoder group having a plurality of sets of first and second comparators, each of said first and second comparators having inputs and an output, said inputs of each of said comparators in a first intermediate stage connected to said outputs of one of said plurality of adder groups of said first stage;
      at least one adder group, each of said adders having a first input connected to said output of said first comparator of one of said sets and a second input connected to said output of said second comparator of one of said sets, and an output, said inputs of each of said comparators in other than said first intermediate stage connected to said outputs of one of said at least one adder group of a previous intermediate stage; and
   a final stage, including:
      a comparator having inputs and an output, said inputs connected to said outputs of a last of said one or more intermediate stages.

2. A recursive decoder for decoding a binary codeword of length N comprising:
   a first stage, including:
      a plurality of decoder groups, each of said groups having a plurality of sets of first and second decoders, each of said first and second decoders having an input and an output;
      a plurality of adder groups, each of said adders having a first input connected to said output of said first decoder of one of said sets, and a second output; connected to said output of said second decoder of one of said sets, and an output;
   an intermediate stage, said intermediate stage including:
      a decoder group, said decoder having a plurality of sets of first and second comparators, each of said first and second comparators having inputs and an output, said inputs of each of said comparators in said intermediate stage connected to said outputs of one of said plurality of adder groups;
      an adder group, each of said adders having a first input connected to said output of said first comparator of one of said sets and a second input connected to said output of said second comparator of one of said sets, and an output; and
   a final stage, including:
      a comparator having inputs and an output, said inputs connected to said outputs of said adder group in said intermediate stage.

3. A recursive decoder for decoding a binary codeword of length N comprising:

a decoder group, said group having a plurality of sets of first and second decoders, each of said first and second decoders having an input and an output;

a plurality of adders, each of said adders having a first input connected to said output of said first decoder of one of said sets and a second input connected to said output of said second decoder of one of said sets, and an output; and a final stage, including:
a comparator having inputs and an output, said inputs connected to said outputs of said adders.

4. A recursive decoder for decoding a binary codeword of length N comprising:

a first stage, including:
a plurality of decoder groups, each of said groups having a plurality of sets of first and second decoders, each of said first and second decoders having an input and an output;
a plurality of adder groups, each of said adders having a first input connected to said output of said first decoder of one of said sets and a second input connected to said output of said second decoder of one of said sets, and an output;

a first intermediate stage, said first intermediate stage, including:
a plurality of decoder groups, each of said decoder groups having a plurality of sets of first and second comparators, each of said first and second comparators having inputs and an output, said inputs of each of said comparators in said first intermediate stage connected to said outputs of one of said plurality of adder groups;

a final intermediate stage, said final intermediate stage including:
a decoder group, said decoder group having a plurality of sets of first and second comparators, each of said first and second comparators having inputs and an output,
an adder group, said adders having a first input connected to said output of said first comparator of one of said sets and a second input connected to said output of said second comparator of one of said sets, and an output;

at least one intermediate stage other than said first or said final intermediate stage, said at least one intermediate stage coupled between said first intermediate stage and said final intermediate stage; and a final stage, including:
a comparator having inputs and an output, said inputs connected to said outputs of said final intermediate stage.

5. A method of decoding a binary code word, comprising the steps of:

decomposing said code word into cosets, each of said cosets having first and second parts;

decoding said first and second parts of each of said cosets in parallel using decoders;

adding outputs from said decoders of said first and second parts of said cosets; and comparing said added outputs to determine the smallest value.

* * * * *